United States Patent [19]

Rydel

[11] Patent Number: 5,266,946
[45] Date of Patent: Nov. 30, 1993

[54] REMOTE CONTROL SYSTEM, IN PARTICULAR FOR LOCKING AND UNLOCKING THE DOORS OF MOTOR VEHICLES WITH TWO AXIALLY OFFSET LIGHT EMITTERS

[75] Inventor: Charles Rydel, Paris, France

[73] Assignee: Valeo Neiman, Croissy-Sur-Seine, France

[21] Appl. No.: 650,757

[22] Filed: Feb. 5, 1991

[30] Foreign Application Priority Data

Feb. 9, 1990 [FR] France .................. 90 01540

[51] Int. Cl.[5] ................ H03J 9/06; H01L 31/12; H01L 33/00
[52] U.S. Cl. ................ 340/825.72; 313/113; 313/512; 250/215; 250/221; 250/239; 250/578.1; 362/296; 362/300
[58] Field of Search .......... 340/825.72, 782, 815.03, 340/815.20; 313/112, 113, 499, 500, 512; 357/17, 19, 21; 307/311; 250/221, 205, 215, 239, 552, 553, 551, 577, 578.1; 437/127, 905, 906; 362/296, 300, 297, 800; 359/366, 732, 710; 180/287

[56] References Cited

U.S. PATENT DOCUMENTS

| | | | |
|---|---|---|---|
| 3,820,237 | 6/1974 | Esser | 437/905 |
| 3,863,075 | 1/1975 | Ironmonger et al. | 313/499 |
| 3,976,877 | 8/1976 | Thillays | 313/499 |
| 4,000,437 | 12/1976 | Lederhandler et al. | 313/512 |
| 4,009,394 | 2/1977 | Mierzwinski | 359/710 |
| 4,364,631 | 12/1982 | Arondel et al. | 359/366 |
| 4,478,588 | 10/1984 | Lockard | 437/906 |
| 4,691,801 | 9/1987 | Mann et al. | 180/287 |
| 4,832,429 | 5/1989 | Nagler | 359/732 |

FOREIGN PATENT DOCUMENTS

| | | |
|---|---|---|
| 2632462 | 1/1978 | Fed. Rep. of Germany . |
| 3803541 | 8/1989 | Fed. Rep. of Germany . |
| 2285722 | 9/1974 | France . |
| 2352313 | 5/1976 | France . |
| 57-68087 | 4/1982 | Japan ............ 357/19 |

OTHER PUBLICATIONS

Patent abstracts of Japan, vol. 9, No. 49 (E-300) [1772], 2 mars 1985; & JP-A-59 189 686 (Roo Mu K.K.) Oct. 27, 1984.
Patent abstracts of Japan, vol. 8, No. 66 (E-234) [1503], 28 mars 1984; & JP-A-58 215 479 (Stanley Denki K.K.) Dec. 16, 1983.

*Primary Examiner*—Donald J. Yusko
*Assistant Examiner*—John Edward Giust

[57] ABSTRACT

A remote control system in particular for locking and unlocking the doors of motor vehicles, the system being of the type including light source forming means associated with optical means adapted to configure the beam generated by the light source, wherein the optical means associated with the light source are adapted to define a transmission lobe centered on an aiming axis and comprising a first component of long range and small beam width together with a second component of shorter range and greater beam width.

1 Claim, 2 Drawing Sheets

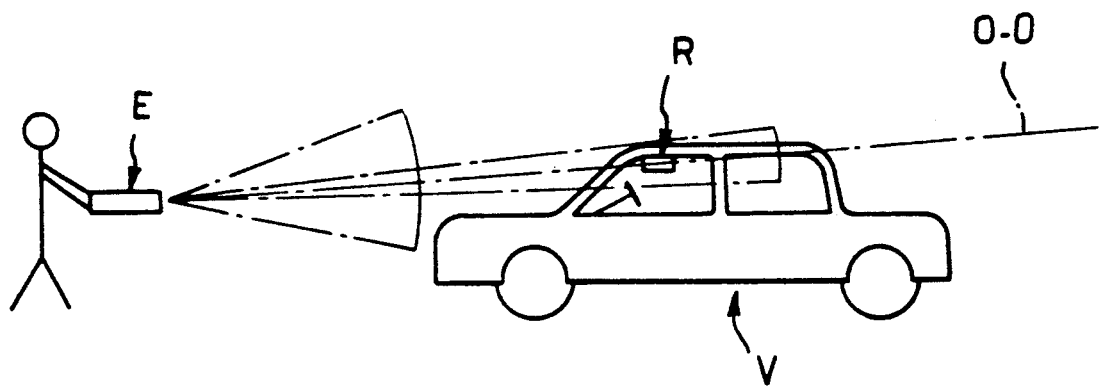
FIG_1
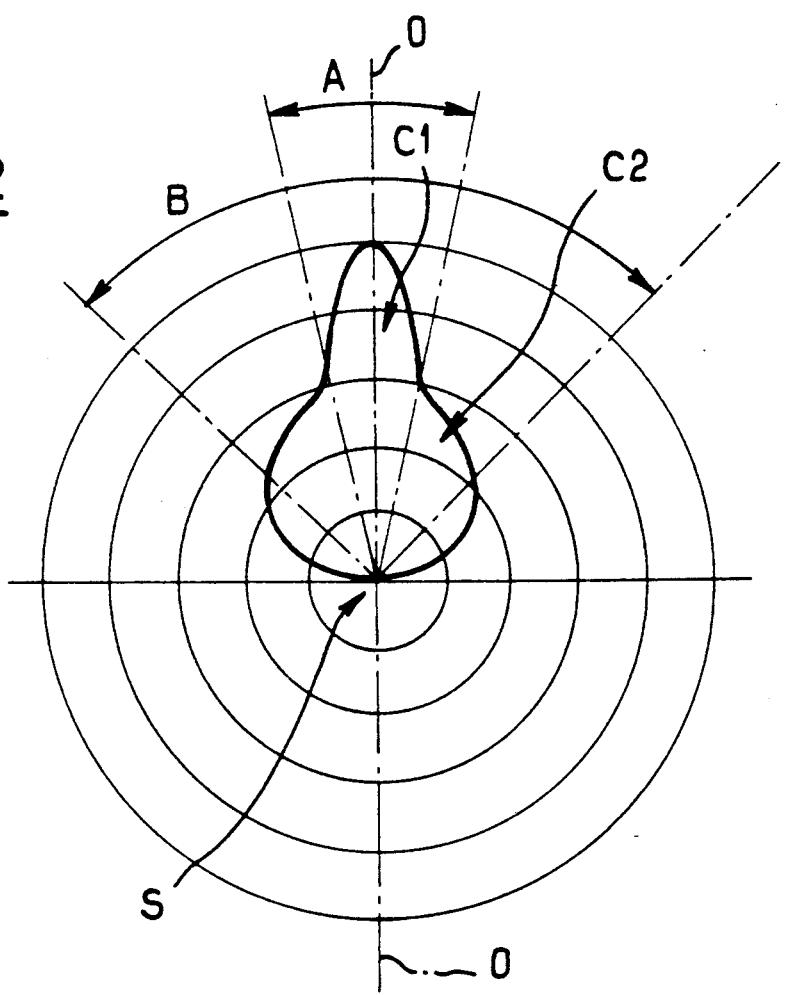
FIG_2

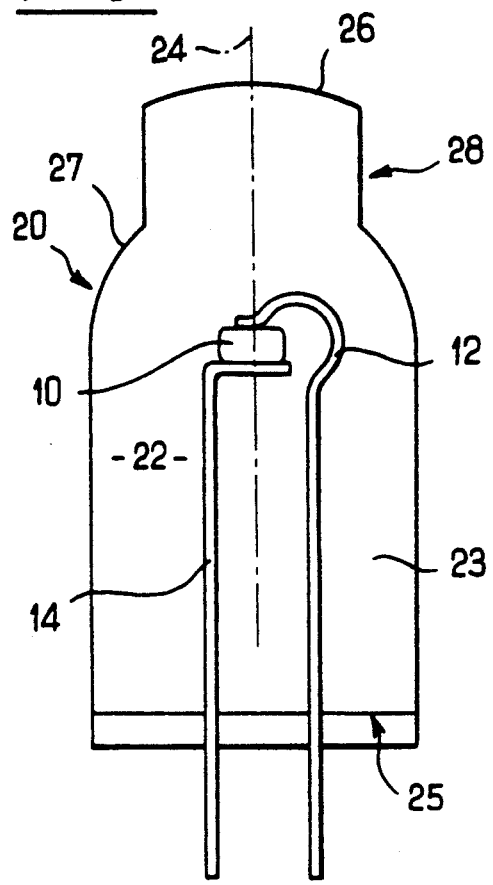
FIG_3
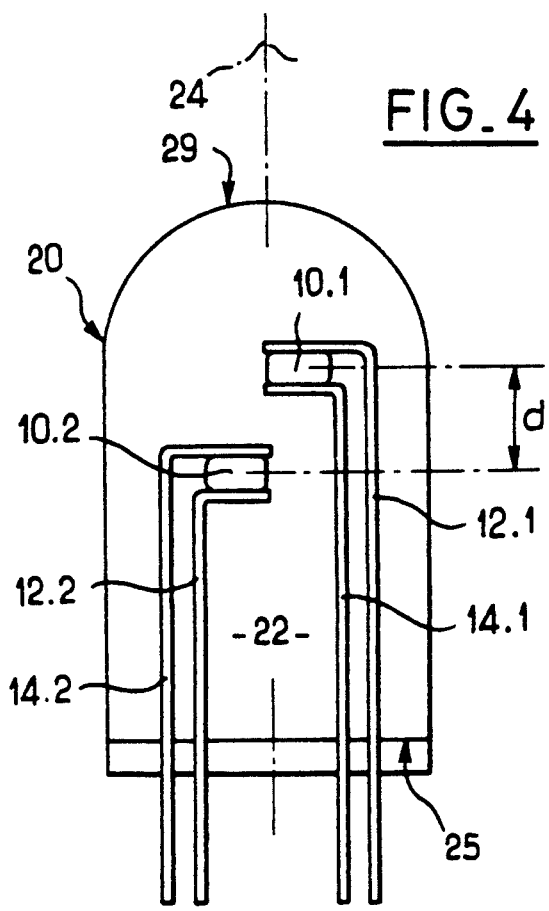
FIG_4
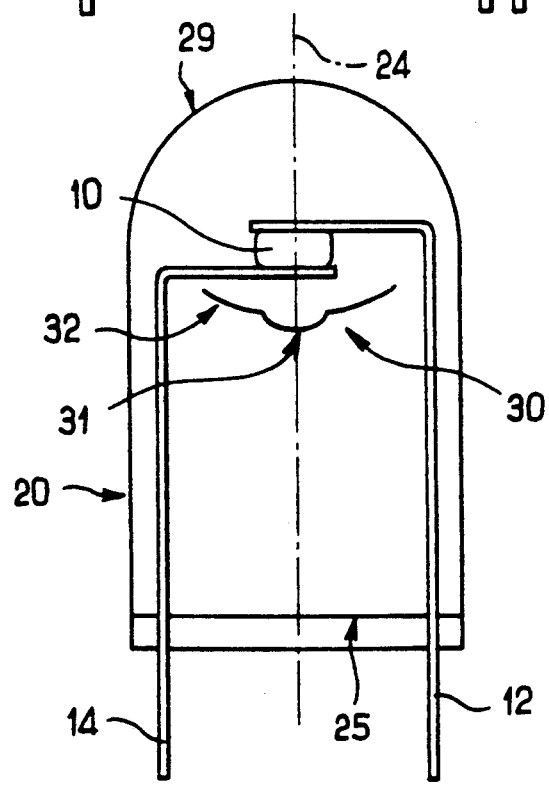
FIG_5

REMOTE CONTROL SYSTEM, IN PARTICULAR FOR LOCKING AND UNLOCKING THE DOORS OF MOTOR VEHICLES WITH TWO AXIALLY OFFSET LIGHT EMITTERS

The present invention relates to remote control systems, in particular via an infrared link.

The present invention applies most particularly to remote control systems for locking and unlocking the doors of motor vehicles.

BACKGROUND OF THE INVENTION

Prior remote control systems generally comprise, at the transmitter end, means constituting a light source suitable for generating an encoded light flux, and associated with optical means adapted to configure the beam generated by the light source.

A main object of the present invention is to propose novel means enabling the range of the transmitter to be optimized.

SUMMARY OF THE INVENTION

In a remote control system of the invention the optical means associated with the light source are adapted to define a transmission lobe centered on an aiming axis and comprising a first component of long range and small beam width together with a second component of shorter range and greater beam width.

BRIEF DESCRIPTION OF THE DRAWINGS

Embodiments of the invention are described by way of example with reference to the accompanying drawings, in which:

FIG. 1 is a diagram of a remote control system of the present invention for locking and unlocking the doors of a motor vehicle;

FIG. 2 is a diagram showing the transmission lobe of a transmitter of the present invention in an axial section plane including the aiming axis; and FIGS. 3, FIG. 4, and FIG. 5 are diagrammatic axial sections through three embodiments of means in accordance with the present invention.

DETAILED DESCRIPTION

Accompanying FIG. 1 is a diagram showing a remote control system of the present invention designed to lock and unlock the doors of a motor vehicle V from a distance. The system comprises a transmitter E and a receiver R.

The transmitter E is placed in a portable box. It is designed to generate an encoded electromagnetic wave, generally in the infrared region of the spectrum.

The receiver R is placed in the vehicle V. It is designed to receive and decode the signal generated by the transmitter E.

When the signal received by the receiver R corresponds to a predetermined code, the receiver R controls locking or unlocking as the case may be of the door of the motor vehicle.

Numerous transmitter and receiver systems have already been proposed for this purpose.

That is why the structure of the transmitter E and of the receiver R is not described in detail below.

In the context of the present patent application, it suffices to describe the final stage of the transmitter E which is constituted, as mentioned above, by a light source associated with optical configuration means.

FIG. 2 is a diagram showing the transmission lobe from a transmitter E of the invention.

In FIG. 2, the aiming direction of the transmitter is referenced O—O. In addition, in FIG. 2, the light source placed at the center of the diagram is referenced S.

More precisely, FIG. 2 shows the transmission lobe in an axial plane, i.e. in a plane containing the aiming direction O—O. In fact, the transmission lobe is circularly symmetrical about the axis constituted by the aiming direction O—O.

In FIG. 2, various concentric circles centered on the source S represent the range of the transmitter.

As can be seen in FIG. 2, the transmission lobe of the invention has two components C1 and C2. The first component C1 is centered on the aiming axis O—O and has long range but relatively narrow beam width A. In contrast, the second component C2 which surrounds the first component C1 and is likewise centered on the aiming axis O—O, has shorter range than the first component but wider beam width. This wider beam width is referenced B in FIG. 2.

More precisely, still as shown in the diagram of FIG. 2, the angular beam width A of the first component C1 is about 30°, i.e. ±15° on either side of the aiming direction O—O.

The second component C2 has greater angular beam width B of about 90°, i.e. ±45° on either side of the aiming axis O—O, but its range is 2 to 2.5 times smaller than the range of the first component C1.

According to the invention, the light source and the associated configuration optical means are preferably in the form of light emitting diodes (LEDs) in the infrared region of the spectrum.

FIG. 3 shows a first embodiment of such a diode in accordance with the present invention.

FIG. 3 shows a crystal 10 connected to two excitation electrodes 12 and 14. When powered by the electrodes 12 and 14, the crystal 10 emits infrared light by electroluminescence.

The crystal 10 is placed in a transparent body 20 designed to configure the transmitted beam.

In conventional manner, the crystal 10 is preferably embedded in a mass 22 of transparent plastic. The plastic may be polymethylmethacrylate (PMMA), for example.

More precisely, as shown in FIG. 3, the crystal is placed in a body 20 comprising a cylindrical block 23 centered on an axis 24. In use, the axis 24 coincides with the aiming aims O—O. The rear face 25 of the block 20 through which the excitation electrodes 12 and 14 emerge extends transversely to the axis 24.

The front face of the body 20 which serves to configure the beam is generally spherical.

More precisely, in the embodiment shown in FIG. 3, the front face 20 is delimited by two portions of a sphere 26 and 27.

The first portion 26 is a central spherical cap centered on a point coinciding with the axis 24.

The second portion 27 is set back behind the first portion 26. It is annular-in shape, being centered on the axis 24, and it surrounds the first portion 26.

The second portion 27 is preferably in the form of a zone of a sphere centered about a point lying on the axis 24.

The two portions 26 and 27 are interconnected by a setback 28 in the form of a circular cylinder about the axis 24.

The person skilled in the art will readily understand that the first portion 26 is designed to configure the first component C1 of the transmission lobe, whereas the second portion 27 is designed to configure the second component C2 of the transmission lobe.

The different ranges and beam widths of the two components can easily be defined by the person skilled in the art by acting on the radii of the two portions 26 and 27 and/or on the distance between the crystal 10 and the center of each of the portions 26 and 27.

In a particular, but non-limiting embodiment: the radius R1 of the first portion 26 is about 2.5 mm; the radius R2 of the second portion 27 is about 3 mm; the distance between the crystal 10 and the center of the portion 26 is about 2.5 mm; and the distance between the crystal 10 and the center of the second portion 27 is about 3 mm.

FIG. 4 shows another variant embodiment of an LED in accordance with the present invention.

In FIG. 4, the front face of the diode body is delimited by a single spherical cap 29 centered on a point lying on the axis 24. However, two LED crystals 10.1 and 10.2 are provided, each associated with a respective pair of electrodes 12.1 & 14.1 and 12.2 & 14.2. Both crystals 10.1 and 10.2 are placed close to the axis 24, on respective opposite sides thereof. In addition, the crystals 10.1 and 10.2 are offset axially through a dittance d.

Co-operation between the front crystal 10.1 and the front face 29 of the diode body defines the first component C1 of the transmission lobe. Co-operation between the back crystal 10.2 and the front surface 29 of the diode body defines the second component C2 of the transmission lobe.

FIG. 5 shows another variant embodiment of a light emitting diode of the present invention.

In FIG. 5, the front face of the diode 20 is delimited by a single spherical cap referenced 29 and centered on a point lying on the axis 24. A single crystal 10 is provided centered on the axis 24. However, in the embodiment of FIG. 5, reflector means 30 are also provided inside the diode body 20 and situated behind the crystal 10, i.e. on the opposite side of the crystal 10 to the spherical outlet face 29.

More precisely, the reflector means 30 comprise two elements 31 and 32.

The central first element 31 comprises a spherical cap which is concave towards the crystal 10 and which is centered on a point lying on the axis 24. The second element 32 is constituted by a spherical zone which is concave towards the crystal 10 and which is centered on the axis 24. The difference between the radii of the two elements 31 and 32 and/or the distance between their respective centers are easily determined by the person skilled in the art to configure the two desired components C1 and C2 of the transmission lobe.

Naturally the present invention is not limited to the embodiment described above, but extends to any variant thereof in accordance with the spirit.

For example, the emitting portion could be in the form of two juxtaposed diode bodies having different distances between their respective light-emitting crystals and the centers of their respective spherical outlet surfaces, and/or having different radii for these outlet surfaces.

It would also be possible to have a smooth transition instead of a sharp jump between the two portions of a sphere 26 and 27 shown in FIG. 3, and/or between the two elements 31 and 32 shown in FIG. 5.

I claim:

1. A remote control system for locking and unlocking the doors of motor vehicles, said system comprising:

a light source and optical means associated with said light source for configuring a beam generated by said light source, said optical means comprising a block of transparent material having a center on an aiming axis, a portion of said block defining of outlet spherical cap having a center located on said aiming axis, said light source comprising two light-emitting crystals which are positioned in close proximity to said aiming axis and on opposite sides thereof and are offset along said aiming axis relative to one another so as to define a transmission lobe external to the optical means and along the aiming axis having a center located on said aiming axis, said transmission lobe comprising a first component characterized by a long range and small beam width and a second component characterized by a shorter range and greater beam width.

* * * * *